United States Patent [19]

Takeda

[11] Patent Number: 5,748,022
[45] Date of Patent: May 5, 1998

[54] INPUT CIRCUIT

[75] Inventor: Kouji Takeda, Beppu, Japan

[73] Assignee: Texas Instruments Incorporated, Dallas, Tex.

[21] Appl. No.: 550,700

[22] Filed: Oct. 31, 1995

[51] Int. Cl.[6] .......................... H03K 5/08; H03K 17/16
[52] U.S. Cl. ..................... 327/313; 327/312; 327/321; 327/328; 327/389; 326/27
[58] Field of Search ........................ 327/309, 310, 327/312, 313, 315–324, 327, 328, 331, 332, 379, 384, 385, 333, 389, 391; 326/21–28, 56–58

[56] References Cited

U.S. PATENT DOCUMENTS

| | | | |
|---|---|---|---|
| 4,570,083 | 2/1986 | Nakaizumi | 326/28 |
| 4,983,861 | 1/1991 | Kikuchi et al. | 326/58 |
| 5,066,875 | 11/1991 | Ueno et al. | 326/27 |
| 5,103,118 | 4/1992 | Peterson | 326/27 |
| 5,347,179 | 9/1994 | Casper et al. | 326/21 |

FOREIGN PATENT DOCUMENTS 3-139915  6/1991  Japan ..................................... 326/27

*Primary Examiner*—Timothy P. Callahan
*Assistant Examiner*—Kenneth B. Wells
*Attorney, Agent, or Firm*—Richard L. Donaldson; William B. Kempler

[57] ABSTRACT

An input circuit which prevents erroneous operation caused by noise. An input stage has a NMOS transistor N11 and a PMOS transistor P11. A NMOS transistor N12 is connected in series between a ground line and the source of the NMOS transistor N11. A PMOS transistor P12 coupled to a voltage supply line $V_{cc}$ acts as a current control element. NMOS transistors N13 and N14 are connected in series between the ground line and the drain of PMOS transistor P12. Inverters IV11 and IV12 delay the voltage of an intermediate output node S11 and supply it to the gate of NMOS transistor N13. The gate of NMOS transistor N12 is coupled to a node S13, the gate of NMOS transistor N14 is coupled to the input line for an input signal IN, and node S13 is formed to function as a voltage sensor with respect to the ground.

3 Claims, 8 Drawing Sheets

INPUT CIRCUIT

FIELD OF THE INVENTION

My invention relates to an input circuit which uses a general use logic MOS.

BACKGROUND OF THE INVENTION

As shown in FIG. 9, an input circuit 10 which uses a conventional general use logic MOS is formed from an inverter made of NMOS transistor N11 and PMOS transistor P11 coupled in series via lead frame inductances L1 and L2 between the ground line and the supply voltage supply line ($V_{cc}$).

Input signals are fed respectively to both transistors P11 and N11 and output node S11 is formed from the node point of the drains of transistors P11 and N11.

Then output node S11 is coupled to the input terminal of output circuit 20 constituted of an inverter composed of PMOS transistor P21 and NMOS transistor N21 coupled in series via lead frame inductances L1 and L2 between the ground line and supply voltage supply line $V_{cc}$, i.e., to the gate of PMOS transistor P21 and NMOS transistor N21.

In an input circuit 10 having this design, when input signals IN are input at a low level (low voltage: ground level), PMOS transistor P11 takes on the ON state and NMOS transistor N11 takes on the OFF state. As a result, output node S11 assumes the supply voltage $V_{cc}$, i.e. becomes HIGH (high voltage). This high level signal is input into output circuit 20, the level is inverted, and an output signal OUT of low level which is the same level as the input signal IN is obtained.

On the contrary, if input signals IN are input at a high level (VCC), PMOS transistor P11 takes on the OFF state and NMOS transistor N11 takes on the ON state. As a result, output node S11 assumes the ground level, namely, the low level. This low level signal is input into output circuit 20, here the level is inverted, and an output signal OUT of high level which is the same level as the input signal is obtained.

FIG. 10 shows a constitutional example of conventional general use logic input circuit 30 containing a flip flop circuit. This input circuit 30 has flip flop F31 and inverters IV31 and IV32 with the same constitution as input circuit 10 shown in FIG. 9.

The input terminal of inverter IV31 is coupled to the clock signal line CK and the output terminal is coupled to the NCK input of flip flop F31. Also, the input terminal of inverter IV32 is coupled to the data input line DT and the output terminal is coupled to the ND input of flip flop F31. Also, output Q of flip flop F31 is coupled to the input terminal of output circuit 20, namely, the gates of PMOS transistor P21 and NMOS transistor N21.

In input circuit 30, clock signals CK inverted in inverter IV31 are fed to input NCK of flip flop F31, and data DT inverted in inverter IV32 are fed to input ND. The level of output node SQ of flip flop F31 makes a transition to a level opposite from the level of output side node SNDT of inverter IV32 when the level of output side node SNCK of inverter IV31 changes to low level from high level.

In the conventional input circuit shown in FIG. 9, a high current flows in a short period of time when the level of output signal OUT of output circuit 20 changes from high level (high voltage) to low level (low voltage) as shown in FIG. 11.

Due to the high current and the influence of lead frame inductance L2, the level of signal ground SGND fluctuates greatly. As noted above, when input signal IN is at low level (ground level), NMOS transistor N11 is OFF but when signal ground SGND fluctuates greatly, the level falls below the level of input signal IN, and exceeds the threshold value of NMOS transistor N11; NMOS transistor N11 is turned ON and the level of output node S11 changes from a high level to low level.

Then, output circuit 20 is influenced by the level change of the output node S11; thus, there was the problem that the level of output signal OUT changes from low level to high level, namely, erroneous operation occurred.

Even in the circuit shown in FIG. 10, as shown in FIG. 12, high current flows in a short period of time when the level of the output signal OUT of output circuit 20 changes to low voltage (low level) from high voltage (high level), and signal ground SGND fluctuates greatly due to the influence of the high current and lead frame inductance L2.

If the signal ground SGND fluctuates greatly when the input voltage of clock signals CK is a low voltage (low level) and signal ground SGND becomes a lower voltage than the input voltage of the clock signal CK and exceeds the threshold value of the transistor, the NMOS transistor constituting inverter IV31 takes on the ON state and changes the voltage of node SNCK from high to low voltage.

At this time, if the voltages of node SQ and node SNDT are the same voltage, there is the problem that node SQ changes into the opposite voltage from node SNDT due to the influence of node SNCK.

My invention takes this situation into consideration and provides an input circuit which can prevent erroneous operation caused by noise.

SUMMARY OF THE INVENTION

In one embodiment my circuit has a first transistor whose gate is coupled to an input line which can receive input signals at first and second levels. The first transistor goes ON when the input signals are at the second level to connect an output node to a power source for the first level. A second transistor whose gate is also coupled to the input line goes ON when the input signals are at the first level to connect the output node to the power source for the second level. A third transistor which is coupled between the second transistor and the power source for the second level, has its gate coupled to a first node and goes ON when the first node is at the first level. A current control element is coupled between the first node and the power source of the first level. Fourth and fifth transistors are coupled in series between the first node and the power source for the second level and go ON when signals of the first level are fed to the The gate of the fourth transistor is coupled to the output node and the gate of the fifth transistor is coupled to the input line. A delay circuit is provided between the output node and the gate of the fourth transistor.

Thus my input circuit has an inverter which converts the input signals of first and second levels into signals of the opposite level and then outputs them. A signal output circuit outputs signals of a level corresponding to the output signal level of the inverter. When a noise detecting circuit detects the presence of noise in the inverter, a holding circuit maintains the signal level of the output side node of the signal output circuit at an unchanged level.

When the input signals are input at the first level, the first transistor is maintained OFF and the second transistor and the fifth transistor are maintained ON. At this time, the output node is maintained at the second level and as a result, the fourth transistor is maintained OFF. Consequently, the first node coupled to the power source of the first level via the current control element is maintained at the first level. Therefore, the third transistor is maintained ON.

When the input signals are at the first level and the second transistor is ON, the output node is coupled to the power source of the second level and is maintained at the second level. The second level signals are input into the output circuit composed of an inverter are etc., inverted and output as signals of first level which is the same level as the input signals are obtained.

When the input signals are input at the second level, the first transistor is maintained ON and the second transistor and fifth transistor are maintained OFF. At this time, the output node is maintained at the first level and as a result, the fourth transistor is maintained ON. However, the fifth transistor is OFF as noted above so the first node continues to be maintained at the first level. Consequently, the third transistor is maintained ON.

If high current flows in a short period of time when the level of the output signals of the output circuit composed of an inverter changes to the second level from the first level, the signal ground fluctuates greatly due to the lead frame inductance and the high current.

Normally, the input signals are at the second level, the third transistor and the fourth transistor are maintained ON, and the second transistor and the fifth transistor are maintained OFF, as described above, so the output node is maintained at the first level but if it assumes a level lower than the level of the input signals and exceeds the threshold value of the transistor due to the signal ground fluctuating greatly, the first transistor makes a transition to the ON state from the OFF state.

At this time, the third transistor is maintained ON so there is an attempt to drop the output node from the first level to the second level but at the same time, the fifth transistor also makes a transition from the OFF state to the ON state. Consequently, the first node is coupled to the power source for the second level, the level changes from the first level to the second level, and as a result, the third transistor makes a transition from the ON state to the OFF state.

Therefore, switching of the output node to the second level is suppressed, the level of the output node continues to be maintained at the first level, and erroneous operation is prevented.

Also, according to the input circuit of my invention, the input signals are inverted in the inverter then are input into the signal output circuit. In the signal output circuit, signals of a level matching to the output signal level of the inverter are output.

Also, the output signals of the inverter are input into the noise detecting circuit and presence of noise is detected. When noise is detected in the noise detecting circuit, the detection signal is input into the holding circuit and is maintained at the level by the holding circuit so that the signal level in the output side node of the signal output circuit does not change.

In the figures, 10a, 10b, 10c, and 10d are input circuits, P11–P13 are PMOS transistors, N11–M15 are NMOS transistors, IV11–IV14 are inverters, L1, L2 are lead frame inductances, S11 is an output node, 20 is an output circuit, P21 is a PMOS transistor, N21 is a NMOS transistor, L21, L22 are lead frame inductances, 30a, 30b are input circuits, IV31–IV43 are inverters, F31 is a flip flop, ND31, ND32 are NAND gates, NR31 is a NOR gate, P31 is a PMOS transistor, P31 is a NMOS transistor, and L31, L32 are lead frame inductances.

DETAILED DESCRIPTION

Embodiment 1

Figure 1:
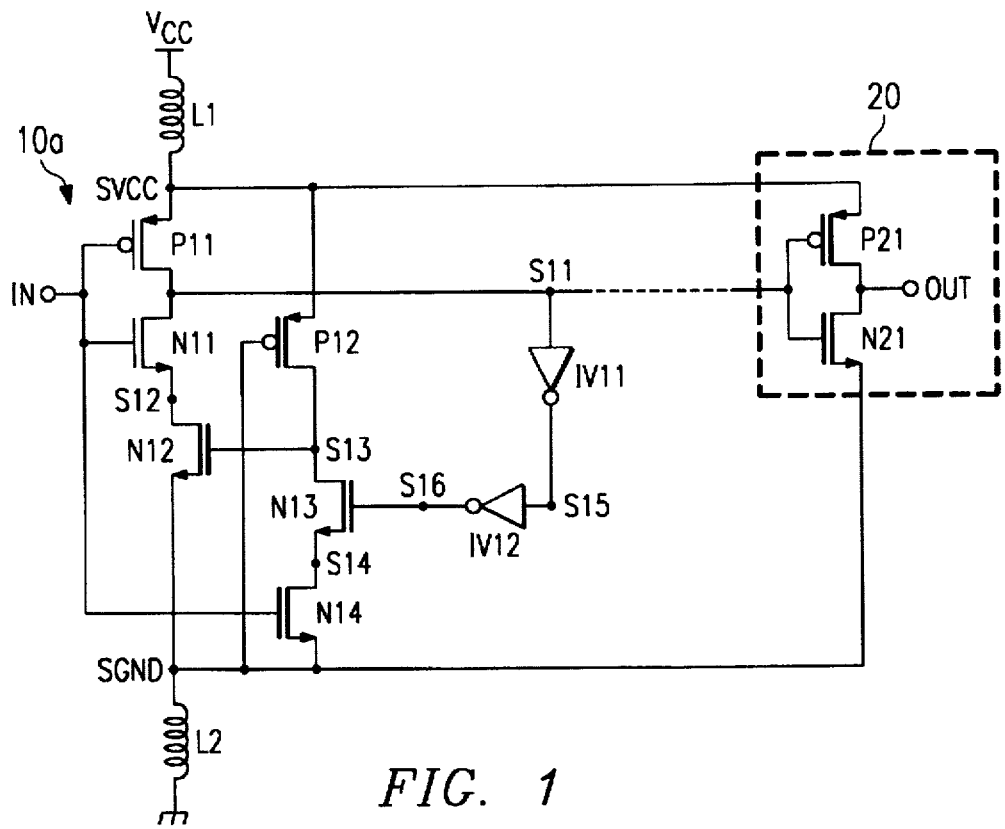
FIG. 1 shows a first embodiment of my input circuit.

FIG. 1 shows a first embodiment of the input circuit. Part 10a is the input circuit and 20 the output circuit. Input circuit 10a has PMOS transistors P11 and P12, NMOS transistors N11, N12, N13, and N14, and inverters IV11, and IV12.

Namely, the gates of PMOS transistor P11 and NMOS transistors N11 and N14 are coupled to the input line of input signal IN. The source of PMOS transistor P11 is coupled to the supply line of power voltage $V_{cc}$ via lead frame inductance L1, the drain is coupled to the drain of NMOS transistor N11, and output node S11 of input circuit 10 is composed of the node point of the drains. Then, along with being coupled to output circuit 20, output node S11 is coupled to the gate of NMOS transistor N13 via coupled in series inverters IV11 and IV12.

The source of NMOS transistor N11 is coupled to the drain of NMOS transistor N12 and node S12 is composed of the node point thereof. The source of NMOS transistor N12 is coupled to the ground line via lead frame inductance L2, the gate is coupled to the drain of PMOS transistor P12 and the drain of NMOS transistor N13, and node S13 is composed from the node point thereof.

The source of PMOS transistor P12 is coupled to power source side lead frame inductance LI and the gate is coupled to ground side lead frame inductance L2. The PMOS transistor P12 has a so-called current control function.

Also, the source of NMOS transistor N13 is coupled to the drain of NMOS transistor N14, and node S14 is composed of the node point thereof. The source of NMOS transistor N14 is coupled to ground side lead frame inductance L2.

Figure 2:
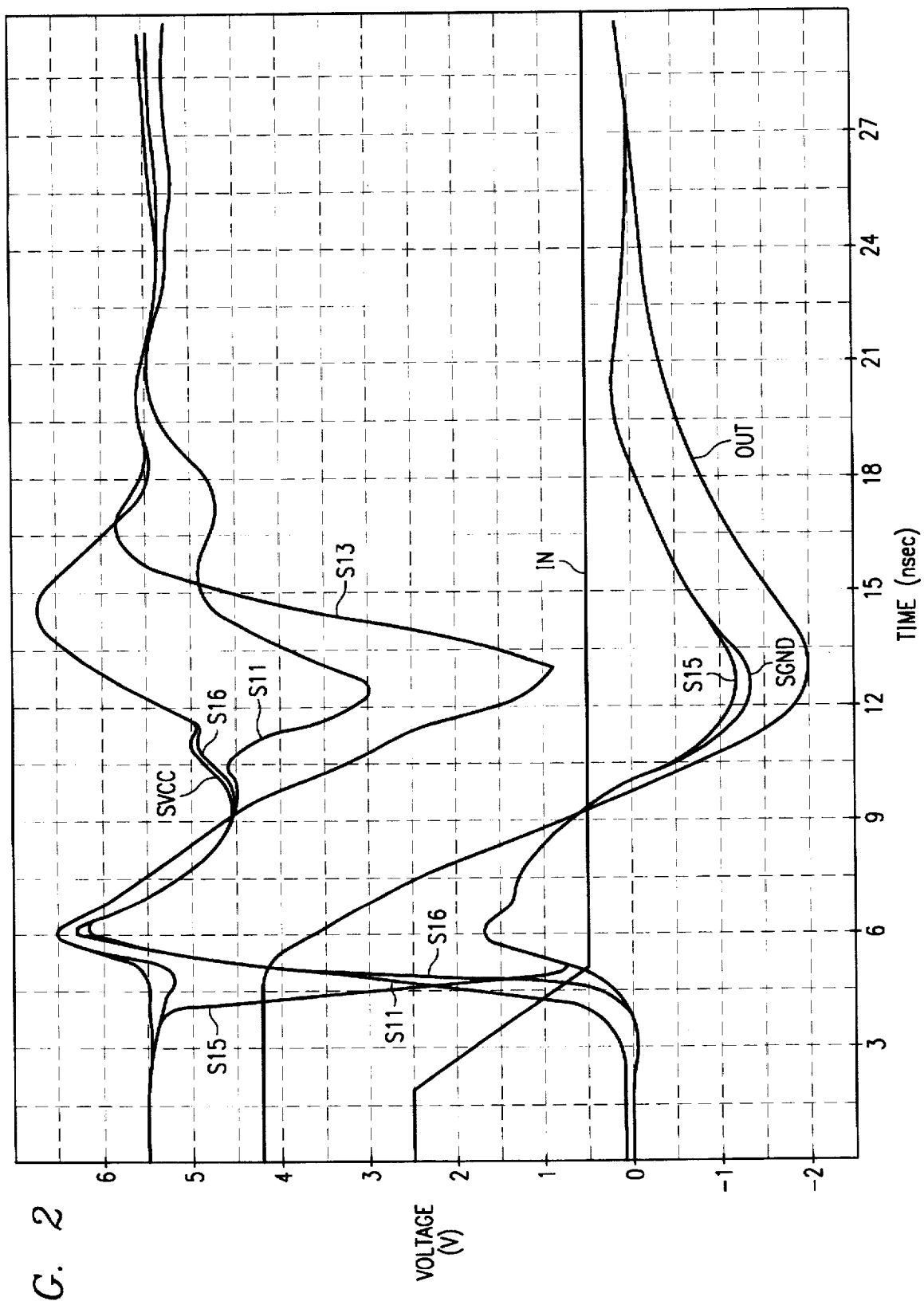
FIG. 2 shows a waveform of the circuit in FIG. 1.

Next, the operation according to this design will be explained while referring to the waveform in FIG. 2. When input signal IN is input at high voltage (high level), PMOS transistor P11 is maintained OFF and NMOS transistors N11 and N14 are maintained ON. At this time, output node S11 is maintained at a low voltage (low level) and as a result, output side node S15 of inverter IV11 is maintained at a high voltage and output side node S16 of inverter IV12 is maintained at a low voltage. Therefore, NMOS transistor N13 is maintained OFF since low voltage is fed to the gate of NMOS transistor N13.

Then, the gate of PMOS transistor P12, acting as the current control element, is coupled to the ground line and PMOS transistor P12 is maintained constantly ON so node S13 is continued to be maintained at a high voltage. Consequently, NMOS transistor N12 is maintained ON.

In the case where NMOS transistors N11 is ON and input signal IN is at the high voltage, as noted above, output lead S11 is coupled to ground level and stably maintained at a low level.

This low level signal is input into output circuit 20, inverted and output signals (OUT) of high level which is the same level as the input signals are obtained.

When input signals IN are input at a low voltage (low level), PMOS transistor P11 is maintained ON and NMOS transistors N11 and N14 are maintained OFF. At this time, output node S11 is maintained at a high voltage (high level) and as a result, output side node S15 of inverter IV11 is maintained at a low voltage and output side node S16 of inverter IV12 is maintained at a high level. Consequently, NMOS transistor N13 is maintained ON since high voltage is fed to the gate of NMOS transistor N13.

However, the gate of PMOS transistor P12, acting as the current control element, is coupled to the ground line, PMOS transistor P12 is constantly maintained ON, and NMOS transistor N14 is OFF, as noted above, so node S13 continues to be maintained at a high voltage. Consequently, NMOS transistor N12 is maintained ON.

In the case where high current flows for a short period of time when the voltage of output signals OUT the output circuit changes from a high to a low voltage, signal ground SGND fluctuates greatly due to the high current and lead frame inductance L2.

Normally, when input signal IN is a low voltage, NMOS transistors N12 and N13 are maintained ON, and NMOS transistors N11 and N14 are is maintained at OFF as noted above so output node S11 maintains a high voltage, but when the signal ground SGND fluctuates greatly and assumes a voltage which is lower than the voltage of input signals IN and exceeds the threshold value of the transistor, NMOS transistor N11 makes a transition from the OFF state to the ON state.

At this time, NMOS transistor N12 is maintained ON so there is an attempt to lower the voltage of output node S11 from high to low voltage but at the same time, NMOS transistor N14 also makes a transition from the OFF state to the ON state. Consequently, node S13 is coupled to ground level, the voltage changes from high to low, and as a result, NMOS transistor N12 makes a transition from the ON state to the OFF state.

Thereby, coupling of output node S11 to ground level is suppressed, the level of output node S11 continues to be maintained at a high level (high voltage), and erroneous operation is prevented.

As explained above, according to the first embodiment, in addition to PMOS transistor P11 and NMOS transistor N11 coupled in series between the ground line and supply voltage $V_{cc}$ of the input stage, NMOS transistor N12 coupled in series between the ground line and source of NMOS transistor N11, PMOS transistor P12 coupled to the voltage supply line $V_{cc}$ as the current control element. NMOS transistors N13 and N14 are coupled in series between the ground line and the drain of PMOS transistor P12, and inverters IV11 and IV12 which delay the voltage of output node S11 and supply it to the gate of NMOS transistor N13 were provided. The gate of NMOS transistor N12 was coupled to node S13, the gate of NMOS transistor N14 was coupled to the input line of input signal IN, and node S13 was constituted to have a function of a sensor with respect to the ground so when input signal IN is at low voltage and output signal OUT of output circuit 20 changes from high to low voltage. NMOS transistors N13 and N14 assume the ON state simultaneously for a short period of time and NMOS transistor N12 is switched into the OFF state so there is the advantage of being able to continue maintaining the voltage of node S11 at a high voltage and being able to prevent erroneous operation.

Embodiment 2

Figure 3:
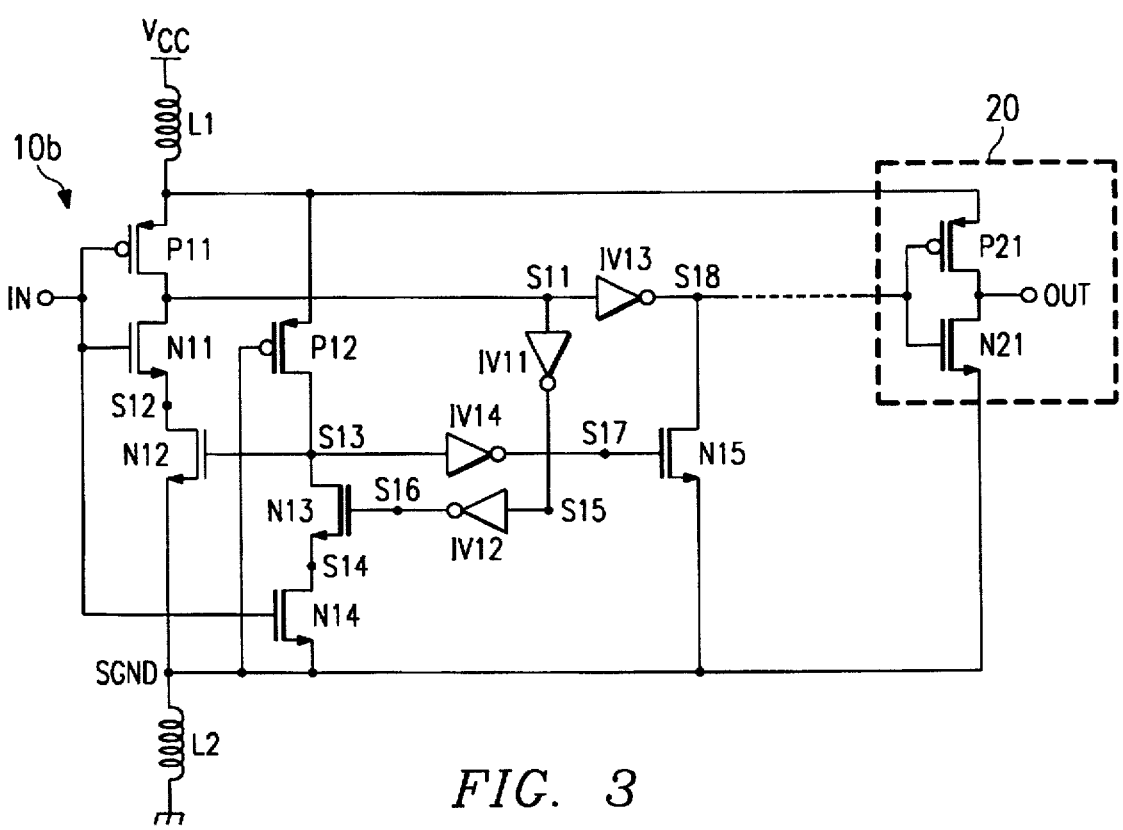
FIG. 3 shows a second embodiment of my input circuit.

FIG. 3 shows a second embodiment of an input circuit. This embodiment differs from the Embodiment 1 in that inverter IV13 is coupled between output node S11 and output circuit 20, NMOS transistor N15 is coupled between lead frame inductance L2 and the output terminal of inverter IV13, node S13 is coupled to the input terminal of inverter IV14, and the output terminal of inverter IV14 is coupled to the gate of NMOS transistor N15.

In this kind of design, NMOS transistor N12 assumes the OFF state when node S13 is changed from high to low voltage according to the noise of signal ground SGND, and along with the voltage of output node S11 being continued to be maintained at high voltage, the voltage of output side node S17 of inverter IV14 changes to high voltage from low voltage, NMOS transistor N15 makes a transition from the OFF state to the ON state, and the voltage of output side node S18 of inverter IV13 continues to be maintained at a low voltage.

Thus, even in the second embodiment, the same effects as in Embodiment 1 can be obtained.

Embodiment 3

Figure 4:
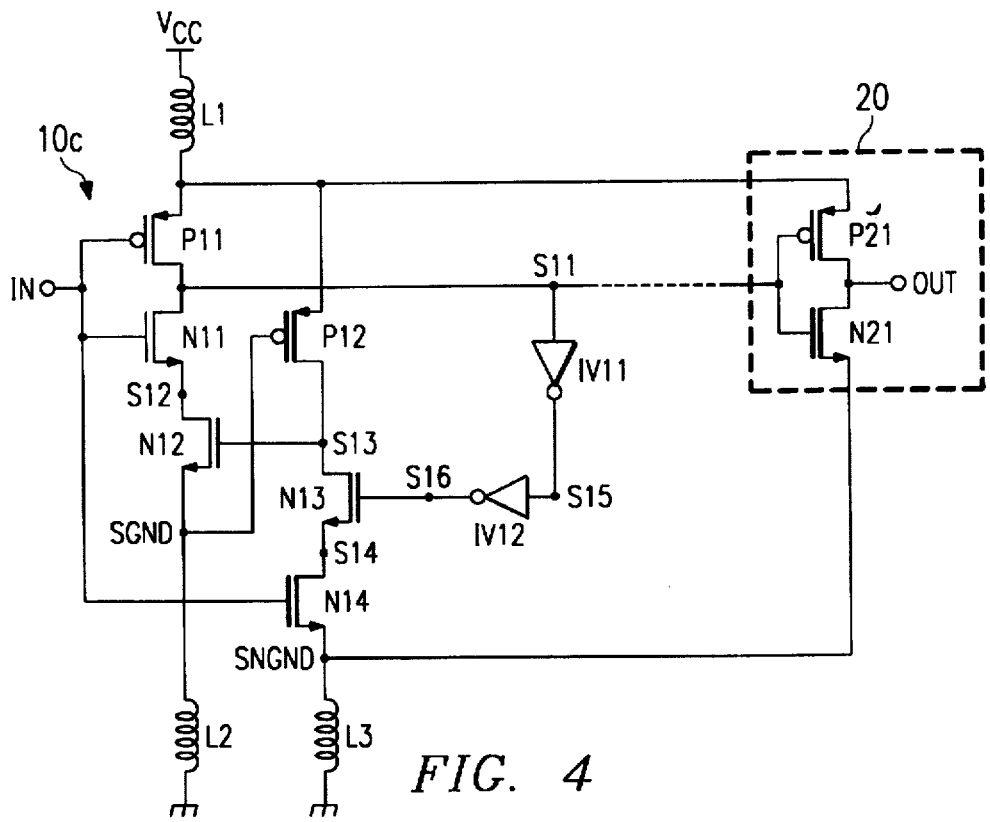
FIG. 4 shows a third embodiment of the input circuit.

FIG. 4 shows a third embodiment of an input circuit.

The point in which this third embodiment differs from the Embodiment 1 is the fact that the ground line coupled to the input step of input circuit 10c and the ground line coupled with NMOS transistor N21 of output circuit 20 and NMOS transistor N14 were separated. Namely, it was constituted by making the lead frame for the ground line into two and separating the lead frame for input circuit 10c from that for other circuits.

By using this type of design, the current flowing in NMOS transistor N21 of output circuit 20 is much greater compared to other transistors so the fluctuation of signal ground SNGND thereof is greater than the fluctuation of other signal ground SGND.

It is possible to prevent erroneous operation by utilizing the difference in the fluctuation between the signal grounds SNGND and SGND.

It is possible to obtain the same effects even when a npn transistor is used instead of a NMOS transistor in output circuit 20.

Embodiment 4

Figure 5:
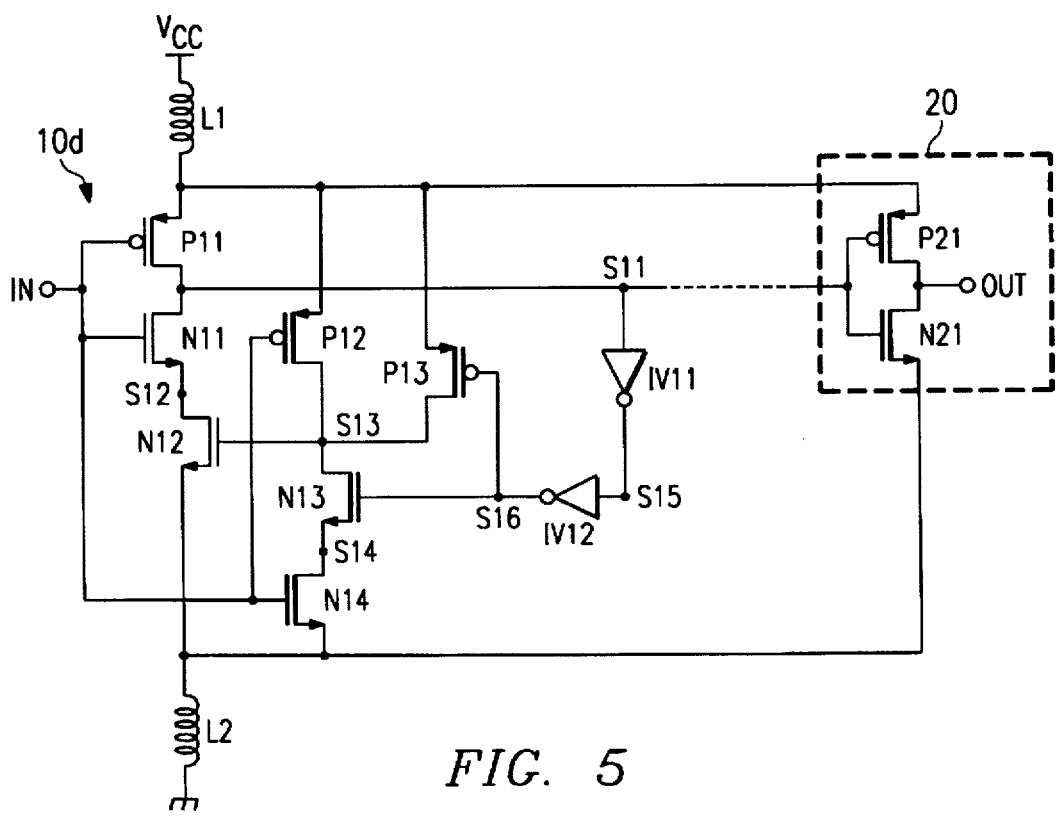
FIG. 5 shows a fourth embodiment of my input circuit.

FIG. 5 shows a fourth embodiment of the input circuit.

The point in which this fourth embodiment differs from aforementioned embodiments is that it was constructed as a NAND gate by connecting PMOS transistor P13 in parallel to PMOS transistor P12, connecting the gate of PMOS transistor P12 to the input line of signal IN instead of the ground line, and connecting the gate of PMOS transistor P13 to node S16.

Even in embodiment, the same effects as the Embodiment 1 can be obtained.

Embodiment 5

Figure 6:
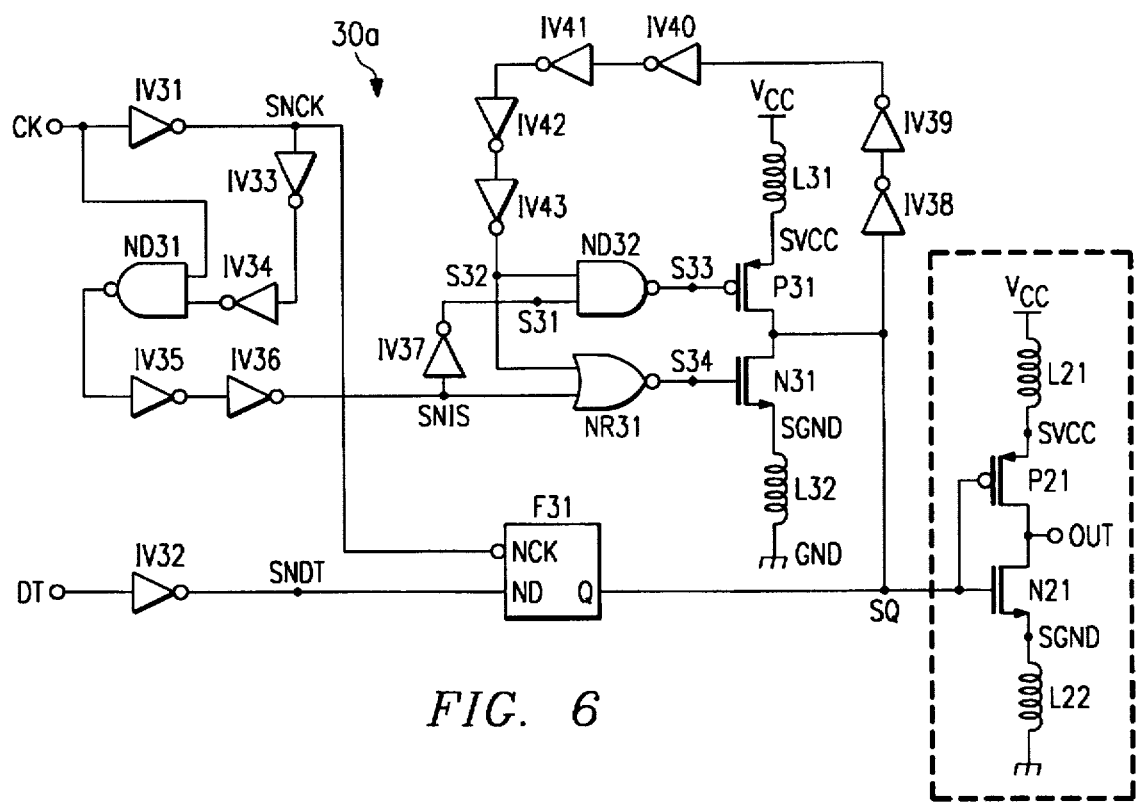
FIG. 6 shows a fifth embodiment of my input circuit.

FIG. 6 shows a fifth embodiment of an input circuit.

Figure 10:
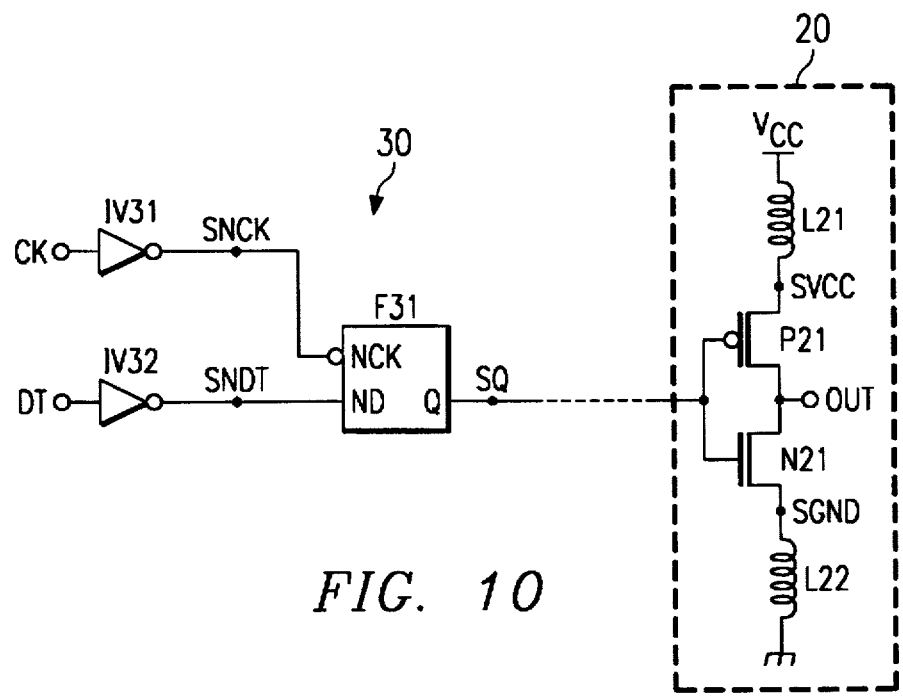
FIG. 10 is a schematic of a conventional input circuit containing a flipflop.
Figure 11:
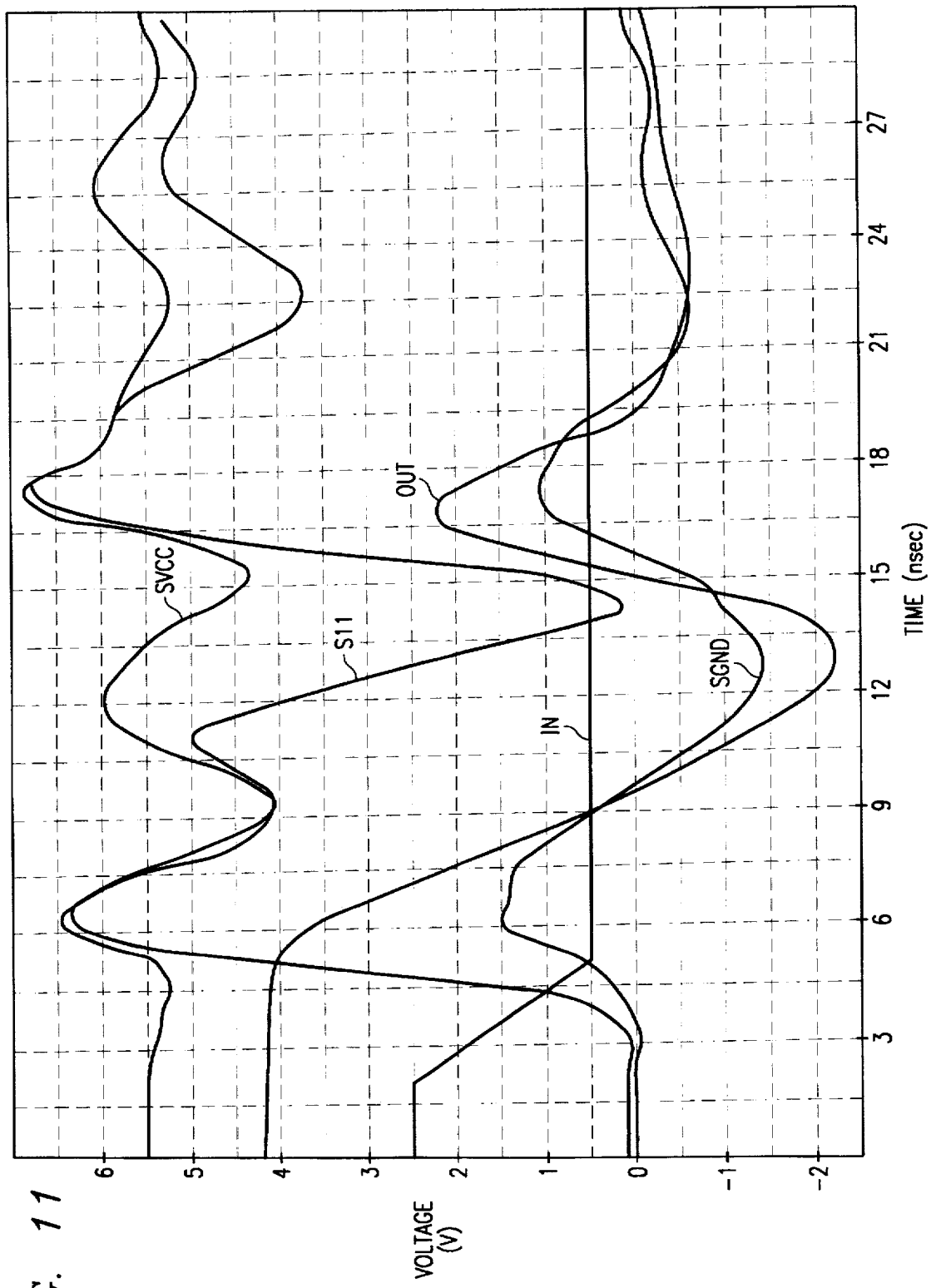
FIG. 11 shows a waveform of the conventional circuit of FIG. 9.
Figure 12:
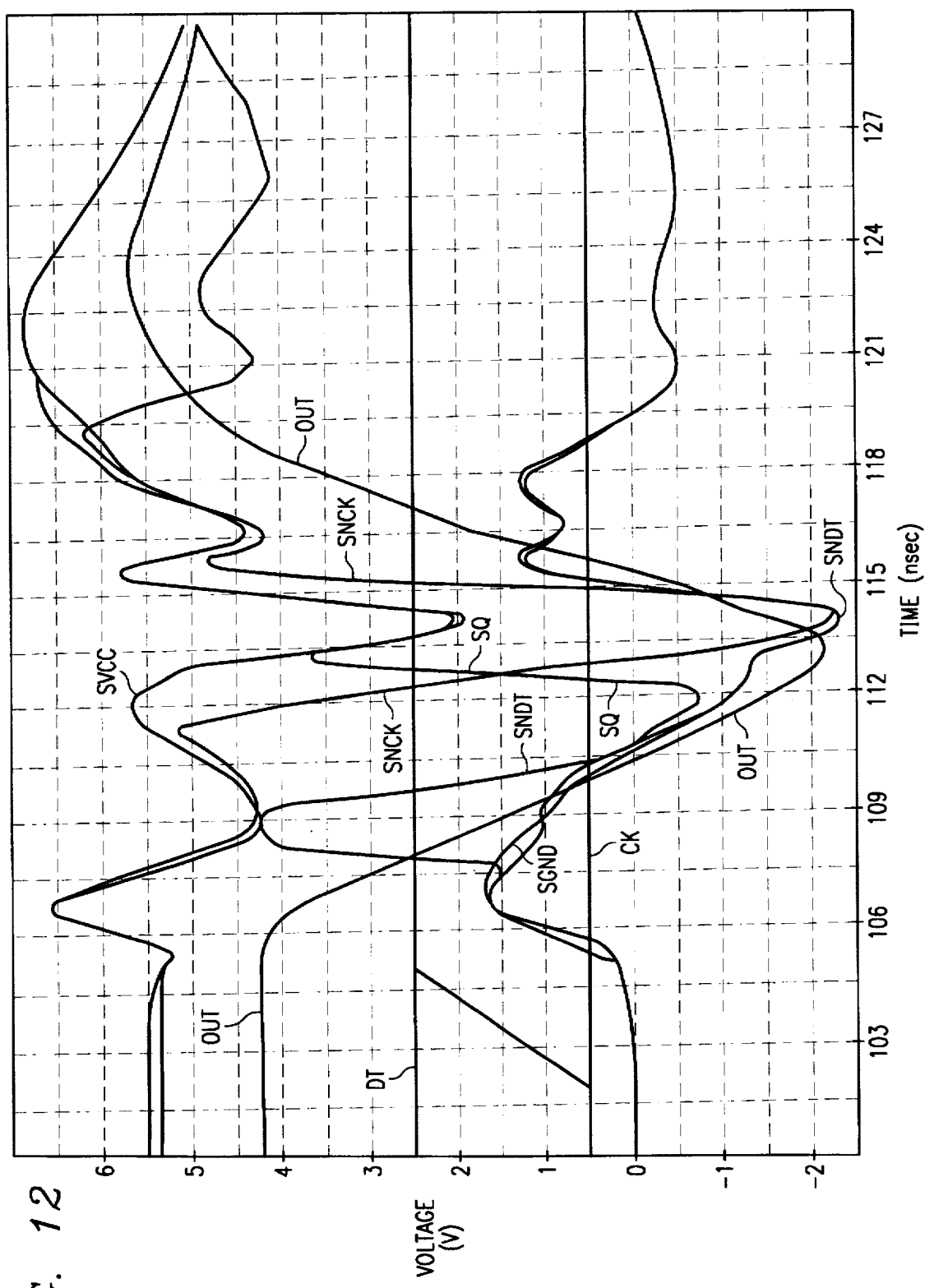
FIG. 12 shows a waveform of the conventional circuit of FIG. 10.

This circuit is general use logic input circuit (30a) which includes a flip flop circuit and component elements which are the same as those FIG. 10 showing a conventional example are given with the same symbols.

Namely, IV31–IV43 are the inverters, F31 the flip flop, ND31 and ND32 the NAND gates, NR31 the NOR gate, P31 the PMOS transistor, N31 the NMOS transistor, and L31 and L32 the lead frame inductance. At least inverters IV31 and IV32 are constructed with PMOS and NMOS transistors coupled in series between the ground line and supply line of power voltage $V_{cc}$ as in the Embodiment 1.

These elements are coupled as follows.

The input terminal of inverter IV31 is coupled to the clock signal input line, the output terminal is coupled to input NCK of flipflop 31 and the input terminal of inverter IV33, and node SNCK is composed of the node point thereof. Also, the input terminal of inverter IV32 is coupled to the data input line DT, and the output terminal is coupled to input ND of flip flop F31. Output Q of flip flop 31 is coupled to output circuit 20 and node SQ is composed of the node point thereof.

Inverters IV33 and IV34 are coupled in series and the output terminal of inverter IV34 is coupled to one input terminal of NAND gate ND31. The other input terminal of NAND gate ND31 is coupled to the input line of clock signal CK and the output terminal is coupled to the input terminal of inverter IV35. The output terminal of inverter IV35 is coupled to the input terminal of inverter IV36, the output terminal of inverter IV36 is coupled to the input terminal of inverter IV37 and one input terminal of 2 input NOR gate NR31, and node SNIS is composed of the node point thereof.

The inverters IV33, IV34 and IV35, IV36 coupled in series constitute the delay circuits and the noise detecting circuit of inverter IV31 is composed of the delay circuits and NAND gate ND31.

The output terminal of inverter IV37 is coupled to one input terminal of NAND gate ND32 and node S31 is composed of the node point thereof. The other input terminal of NAND gate ND32 and NOR gate NR31 is coupled to the output terminal of inverter IV43 and node S32 is composed of the node point thereof.

Also, the output terminal of NAND gate ND32 is coupled to the gate of PMOS transistor P31, and the output terminal of NOR gate NR31 is coupled to the gate of NMOS transistor N31. The source of PMOS transistor P31 is coupled to the voltage supply line $V_{cc}$ via lead frame inductance L31, the source of NMOS transistor N31 is coupled to the ground line via lead frame inductance L32, and the node point of the drains of the transistors is coupled to the input terminal of inverter IV38 and node SQ. Inverters IV38–IV43 are coupled in series and compose a delay circuit.

A holding circuit which maintains the level of node SQ unchanged regardless of the output of flip flop 31 when noise is detected by the noise detecting circuit is composed of the delay circuit, inverter IV37, NAND gate ND32, NOR gate NR31, PMOS transistor P31, and NMOS transistor N31.

Next, the operation according to this design will be explained with reference to FIG. 7.

Figure 7:
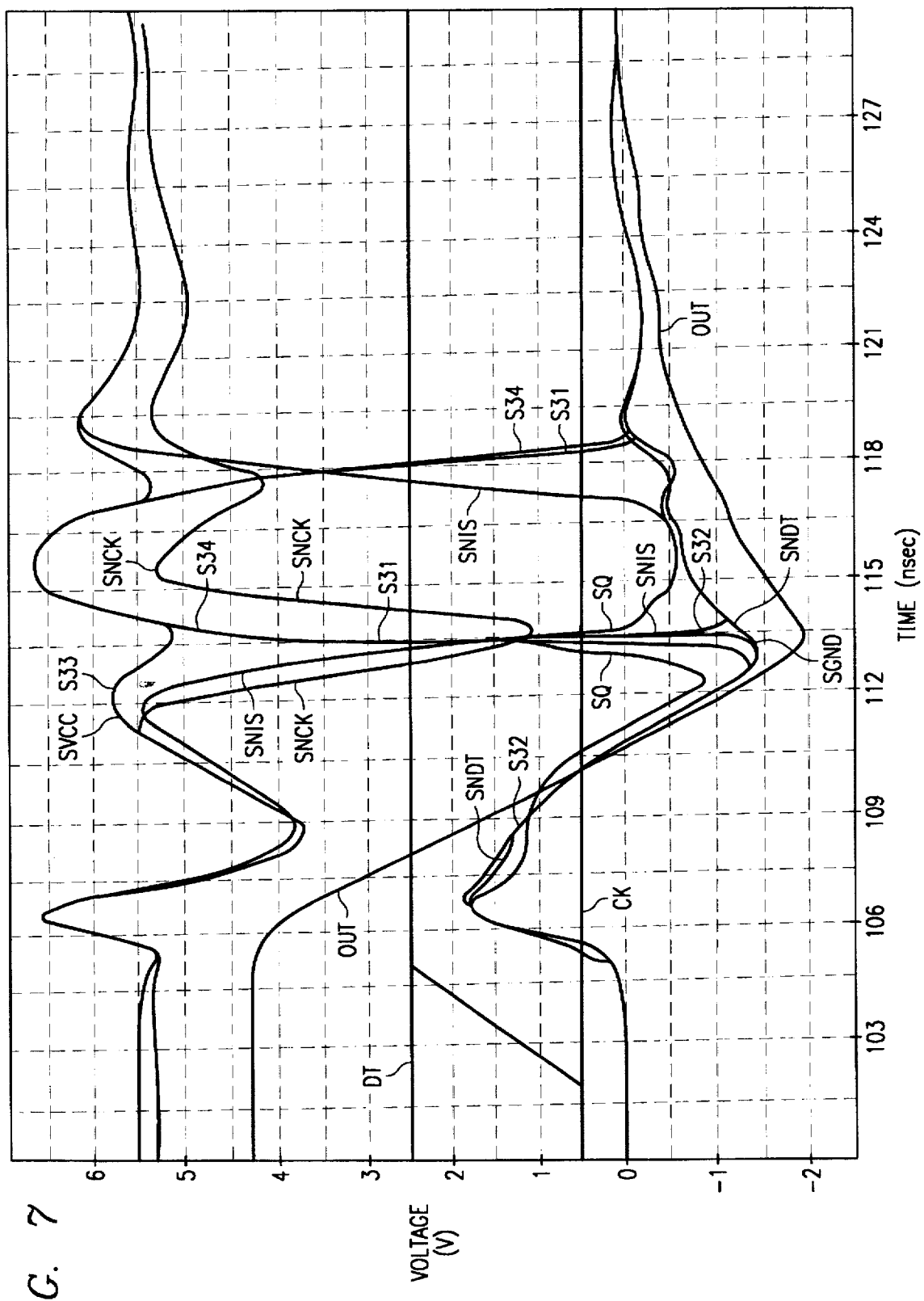
FIG. 7 is a waveform for illustrating the operation of the embodiment of FIG. 6.
Figure 9:
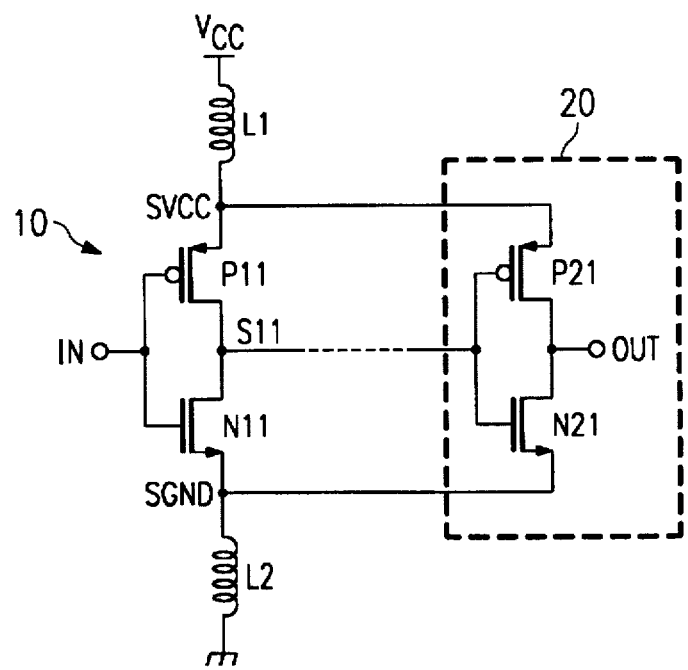
FIG. 9 is a schematic of a conventional input circuit.

As shown in FIG. 7, when output signals OUT of output circuit 20 change from high voltage (high level) to low voltage (low level), signal ground SGND fluctuates greatly due to the influence of the inductance of the lead frame and high current.

Here, when the input voltage of clock signal CK is a low voltage, the signal ground of inverter IV31 fluctuates greatly and when it becomes a voltage which is lower than the input voltage of clock signal CK and exceeds the threshold value of the transistor, the voltage of output side node SNCK of inverter IV31 changes from high to low voltage.

Due to the voltage change in node SNCK, there is an attempt for the voltage of output side node SQ of flip flop F31 to change from low to high voltage. At this time, noise information from NAND gate ND31 which has a role of a noise detection sensor is propagated to node SNIS via inverters IV35 and IV36 and the voltage of node SNIS changes from high to low voltage.

At this time the voltage of node S32 is still maintained at low voltage. Therefore, output side node S34 of NOR gate NR31 assumes a high voltage and NMOS transistor N31 is maintained at the ON state. In that way, node SQ, which was making a transition to high voltage (high level), is led to the ground level and returned to low voltage (low level).

Node S31 changes from low to high voltage due to inverter IV37 but node S32 is at a low voltage so output side node S33 of NAND gate ND32 continues to be maintained at a high voltage. Node S33 is at a high voltage so PMOS transistor P31 is maintained unchanged in the OFF state. Therefore, node SQ is maintained at a low voltage without being influenced by the noise.

If node SQ is at a high voltage, node S32 is maintained at a high voltage so output side node S34 of NOR gate NR31 is maintained unchanged at a low voltage and NMOS transistor N31 is maintained unchanged in the OFF state.

The voltage of output side node S33 of NAND gate ND32 becomes a low voltage since, node S32 changes to high voltage and node S31 changes to high voltage. When the voltage of node S33 thus becomes a low voltage, PMOS transistor P31 takes on the ON state and the voltage of node SQ is maintained at a high voltage.

According to the fifth embodiment, a noise circuit having NAND gate ND31 and a delay circuit composed of inverters IV33, IV34 and IV35, IV36 coupled in series and a holding circuit having delay circuits composed of inverters IV38–IV43, inverter IV37, AND gate ND32, NOR gate NR31, PMOS transistor P31, and NMOS transistor N31 are provided. By changing node SNIS from high to low voltage when noise is generated in inverter IV31, NMOS transistor N31 is switched into the ON state and voltage of node SQ is maintained at a low voltage if the voltage of output side node SQ of flip flop F31 is low, and PMOS transistor P31 is switched into the ON state with the function of NAND gate ND32 and the voltage of node SQ is continued to be maintained at a high voltage when the voltage of node SQ is high, so erroneous operation according to so-called simultaneous switching noise can be prevented.

Embodiment 6

Figure 8:
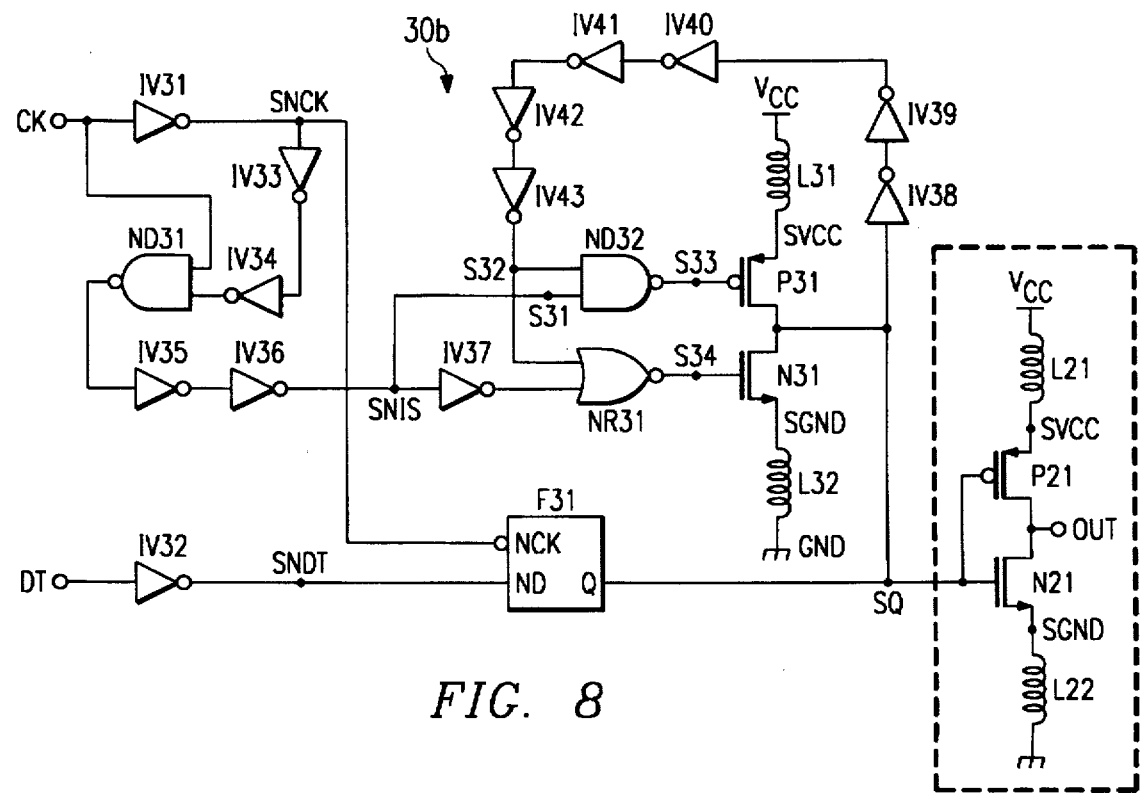
FIG. 8 shows a sixth embodiment of my input circuit

FIG. 8 is a circuit diagram showing a sixth embodiment of an input circuit. This sixth embodiment differs from the Embodiment 5 in that the output terminal of inverter IV37 is coupled to NOR gate NR31 and not to NAND gate ND32. The voltage of node SQ is maintained when noise is generated and node SNIS changes from low to high voltage. This embodiment achieved the same improvements as embodiment 5.

Accordingly to my novel input circuits reliably prevent erroneous operation caused by noise.

I claim:

1. An input circuit for converting input signals having first and second levels, received on an input line, into output signals of the opposite level at an output node, comprising:

a first transistor having a control electrode coupled to the input line, which goes ON when the input signals are at the second level, for coupling the output node to a first level power source;

a second transistor having a control electrode coupled to the input line, which goes ON when the input signals are at the first level, and couples the output node to a second level power source;

a third transistor coupled between the second transistor and the second level power source having a control electrode coupled to a first node and which goes ON when the first node is at the first level;

a current control element coupled between the first node and the first level power source; and fourth and fifth transistors coupled in series between the first node and the second level power source, which go ON when signals of the first level are fed to a control electrode;

the control electrode of the fourth transistor being coupled to the output node and the control electrode of the fifth transistor being coupled to the input line.

2. The input circuit of claim 1 further including a delay circuit coupled between the output node and the control electrode of the fourth transistor.

3. An input circuit for converting input signals having first and second levels, comprising:

an inverter for (i) converting an input signal into a signal of the opposite level and (ii) providing the opposite level signals to a node;

an output circuit coupled to the node and responsive to the inverter, for generating output signals having a level which corresponds to the signal at the node in the absence of noise at the node;

a noise detecting circuit including a noise detection sensor for detecting noise in the input signal, and a holding circuit, having an input coupled to an output of the noise detecting circuit and responsive thereto, and having an output coupled to the input of the output circuit for maintaining the output signal level of the output circuit at a current level when the noise detecting circuit detects noise.

* * * * *